United States Patent [19]

Fujita

[11] Patent Number: 4,644,322
[45] Date of Patent: Feb. 17, 1987

[54] ANALOG-TO-DIGITAL CONVERTER

[75] Inventor: Tsuneo Fujita, Tokyo, Japan

[73] Assignee: Nippon Electric Co., Ltd., Tokyo, Japan

[21] Appl. No.: 435,965

[22] Filed: Oct. 22, 1982

[30] Foreign Application Priority Data

Oct. 26, 1981 [JP] Japan .................................. 56-171146

[51] Int. Cl.[4] .................. H03M 1/00; H03M 7/16
[52] U.S. Cl. ...................... 340/347 AD; 340/347 M; 340/347 DD
[58] Field of Search .................. 340/347; 370/371; 364/466

[56]  References Cited

U.S. PATENT DOCUMENTS

| | | | |
|---|---|---|---|
| 3,210,756 | 10/1965 | Flood | 340/347 |
| 3,560,959 | 2/1971 | Bergey | 340/347 |
| 3,678,388 | 7/1972 | Peterson | 340/347 |
| 3,824,587 | 7/1974 | Fowler | 340/347 P |
| 3,868,678 | 2/1975 | Michael | 340/347 AD |
| 4,110,745 | 8/1978 | Ninomiya | 340/347 |
| 4,122,439 | 10/1978 | Ninomiya | 340/347 |
| 4,143,366 | 3/1979 | Lewis | 340/347 |
| 4,146,873 | 3/1979 | Yamanaka et al. | 340/347 P |
| 4,311,987 | 1/1982 | Taillebois | 340/347 P |
| 4,313,508 | 2/1982 | Düppre | 364/466 X |
| 4,342,910 | 8/1982 | Pfeifer et al. | 340/347 P |
| 4,386,339 | 5/1983 | Henry et al. | 340/347 AD |

OTHER PUBLICATIONS

Sheingold: Analog-Digital Conversion Notes, (textbook published by Analog Devices, Inc.) Norwood, MA., copyright 1977, pp. 102-104.
J. D. Greenfield, "Practical Digital Design Using IC's", pp. 345-347, figure (12-'81).
IEEE Journal of Solid State Circuits, vol. SC-14, No. 6, Dec. 1979, "Monolithic Expandable 6-bit 20 MHz CMOS/SOS A/D", p. 926, by Dingwall.
Andrew G. F. Dingwall, "Monolithic Expandable 6 Bit CMOS/SOS A/D Converter", ISSCC Digest of Technical Paper, pp. 126-127, 1979.

Primary Examiner—Felix D. Gruber
Attorney, Agent, or Firm—Blakely, Sokoloff, Taylor & Zafman

[57] ABSTRACT

A parallel comparison type A/D converter comprises a voltage divider having $2^N$ divider junctions connected in series between a reference voltage terminal and a ground potential terminal, $2^N$ comparators for receiving as reference voltages the outputs of the respective divider junctions, a position detection logic circuit for receiving the outputs of the comparators, an encoder for receiving the output of the position detection logic circuit, and a code converter for receiving the output of the first digital encoder. The encoder adopts the Gray code format, and the code converter converts the Gray code format into the binary code format.

6 Claims, 7 Drawing Figures

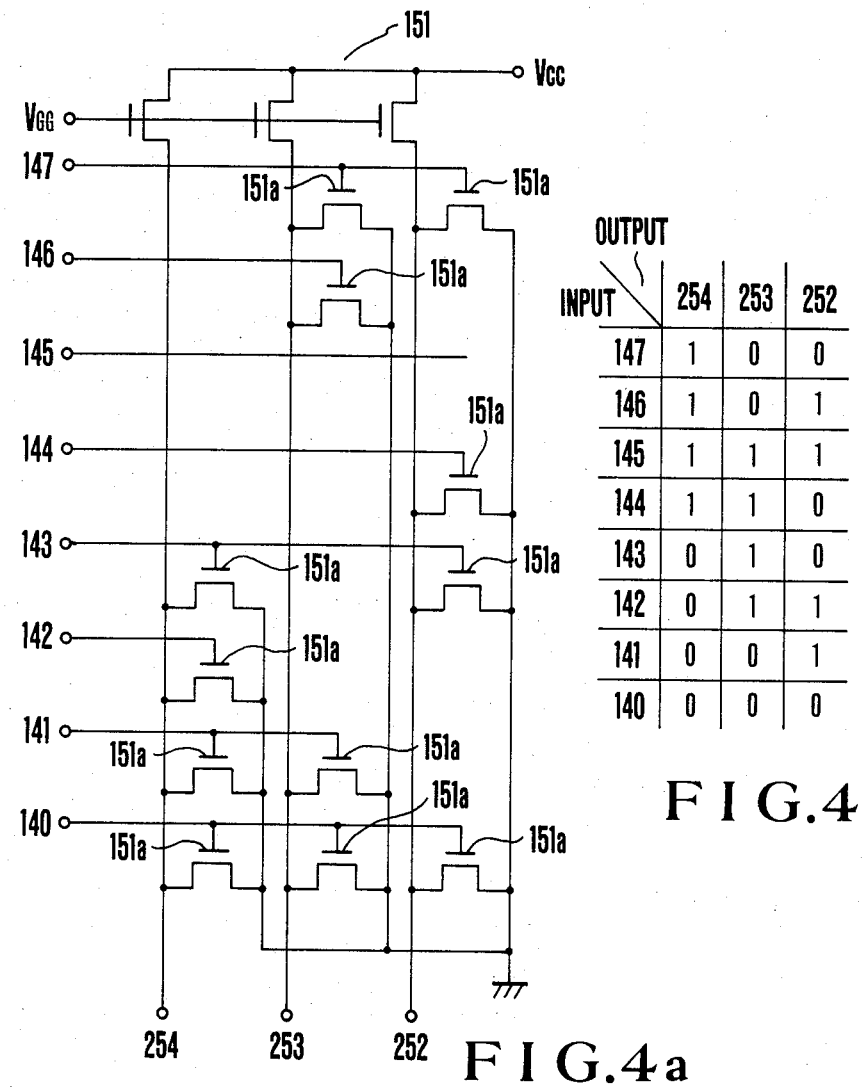
FIG.4a
FIG.4b
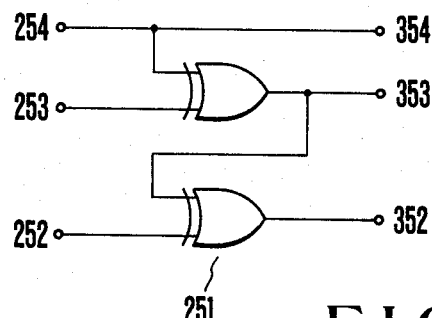
FIG.5

ANALOG-TO-DIGITAL CONVERTER

BACKGROUND OF THE INVENTION

This invention relates to analog-to-digital (hereinafter referred to as A/D) converters and, more particularly, to a parallel comparison type A/D converter using a voltage divider.

A parallel comparison type A/D converter has a construction, in which an analog input voltage $V_s$ is applied to $2^N$ comparators to which different output voltages from a voltage divider dividing a reference voltage $V_R$ are supplied as respective reference voltages, the results of comparison of the input voltage with the reference voltages in the comparators being encoded to produce a digital output, and it is disclosed in, for instance, Andrew G. F. Dingwall, "Monolithic Expandable 6 Bit CMOS/SOS A/D Converter", ISSCC Digest of Technical Paper, PP. 126–127, 1979.

FIG. 1 shows an example of the parallel comparison type A/D converter, in which N=3. Numeral N represents the number of bits of the digital output of the A/D converter. The A/D converter comprises a voltage divider 10 which includes a plurality of resistors 12 to 19 connected in series. Junctions of adjacent resistors constitute respective output terminals 20 to 27. The voltage divider 10 is connected between a reference voltage terminal $V_R$ and a ground potential terminal GND. The output terminals 20 to 27 of the voltage divider 10 are connected to reference voltage input terminals of respective comparators 30 to 37. The outputs of the comparators 30 to 37 are coupled to respective logic gates 40 to 47 which constitute a position detection logic circuit 50. The outputs of the position detection logic circuit 50 are coupled to an encoder circuit 51 which has digital output terminals 152 to 154.

In operation, an analog input voltage $V_s$ is applied simultaneously to the comparators 30 to 37 which are referenced by different voltages. At this time, comparators, in which the analog input voltage exceeds the reference voltage, provide a low level output, i.e., a "0" output (after inversion). On the other hand, comparators, in which the analog input voltage $V_s$ is below the reference voltage, provide a high level output. i.e., a "1" output (after inversion). In other words, with respect to values of the analog input voltage $V_s$ the comparators 30 to 37 are classed into two groups, namely one consisting of comparators providing the "0" output and the other consisting of comparators providing the "1" output. The position detection logic circuit 50 detects the boundary between the "0" output comparator group and "1" output comparator group. Thus, of the logic gates 40 to 47, one corresponding to the boundary position provides a "1" output. The output of the position detection logic circuit 50 is encoded in the encoder 51 to obtain a 3-bit digital output. In many cases, a read only memory (ROM) type encoder as shown in FIG. 2a is used as the encoder 51, and its output is a binary code as shown in FIG. 2b. In FIG. 2a, designated at 140 to 147 are selection input terminals, and at 152 to 154 are digital output terminals. The encoder 51 has a control terminal pattern corresponding to the binary code format and respective control terminals 51a are connected to corresponding one of the selection input terminals 140 to 147. When an operation signal VGG is applied, each of the digital output terminals 152 to 154 receive either direct power source voltage $V_{cc}$ (logic "1") or ground potential (logic "0") responsive to turn-on of the associated control terminal. With this encoder 51 using a binary code, however, an entirely different code is produced if two selection input terminals are simultaneously selected. For example, if it happens that the comparison between analog input voltage $V_s$ and reference voltage in the comparator 33, for instance, produces too small a difference to cause perfect inversion of the comparator output so that the output is at an intermediate level "X" between "0" and "1", the intermediate level is supplied to inputs of the gates 42 to 44 in the position detection logic circuit 50. At this time, the output of the gate 42 is "0" since the output of the comparator 32 is completely "0".

Also, since the outputs of the comparators 34 to 37 are all "1", the outputs of the gates 43 and 44 are determined by the output level "X" of the comparator 33. At this time, if the input threshold value $V_{TP}$ of the voltage on the non-inverted input terminal of the gate 43 is somewhat lower than the rated value while the input threshold value $V_{TN}$ of the voltage on the inverted input terminal of the gate 44 is somewhat higher, the non-inverted input to the gate 43 is "1" while the inverted input to the gate 44 is "0", so that both the gates 43 and 44 provide a "1" output. In consequence, the selection input terminals 143 and 144 of the encoder 51 are simultaneously selected. That is, the binary code "011" corresponding to the selection input terminal 143 and the binary code "100" corresponding to the selection input terminal 144 overlap on each other, so that an entirely different binary code of "000" appears at the output terminals of the encoder 51. This phenomenon is a fatal defect to the A/D converter. More particularly, instead of a normal sequence of codes such as "011"→"100", there occurs an abnormal sequence of codes such as "011"→"000"→"100", that is, monotonicity of the A/D converter is impaired. In order to eliminate the occurrence of such a situation, it is necessary to prevent the comparator output from assuming an intermediate level at any time. To this end, precision and gain of the comparator must be increased.

However, as mentioned earlier, the parallel comparison type A/D converter requires $2^N$ comparators where N is the number of bits of the A/D converter output. That is, if it is intended to increase the precision of conversion by increasing the bit number N, an increased number of comparators must be used. The fact that these many comparators require high precision of comparison and high gain necessarily leads to a complicated and large-scale circuit construction. Such a parallel comparison type A/D converter does not permit easy design for its implementation as a monolithic IC. Besides, an increased chip area is inevitable.

SUMMARY OF THE INVENTION

The invention is predicated on the fact that the generation of an abnormal code output due to an overlap selection by the encoder accrues from the code conversion format employed and its object is to provide a simplified parallel comparison type A/D converter suitable for formation of a monolithic integrated circuit in the form of a sole MOS transistor structure and which does not require a number of comparators used to be of high comparison precision and gain.

According to the invention, a parallel comparison type A/D converter comprises a voltage divider having $2^N$ divider junctions connected in series between a reference voltage terminal $V_R$ and a ground potential terminal GND, $2^N$ comparators for receiving as reference voltages the outputs of the respective divider junctions, a position detection logic circuit for receiving the outputs of the comparators, an encoder for receiving the output of the position detection logic circuit, and a code converter for receiving the output of the encoder.

Specifically, the encoder adopts the Gray code format. In the Gray code format, unlike the binary code format in which the codes representing sequential numbers may differ in a plurality of bits such as "001"→"010" and "001"→"100" as shown in FIG. 2b, the codes differ only in one bit shown in FIG. 4b.

BRIEF DESCRIPTION OF THE DRAWINGS

FIG. 4a illustrates an example of a read only memory type encoder based on the Gray code system;

FIG. 4b is a diagram showing 3-bit Gray code outputs of the FIG. 4a encoder; and FIG. 5 is a circuit diagram showing an example of a code converter for converting a Gray code into a corresponding binary code.

DESCRIPTION OF PREFERRED EMBODIMENT

The invention will now be described in detail in conjunction with an embodiment thereof.

Figure 1:
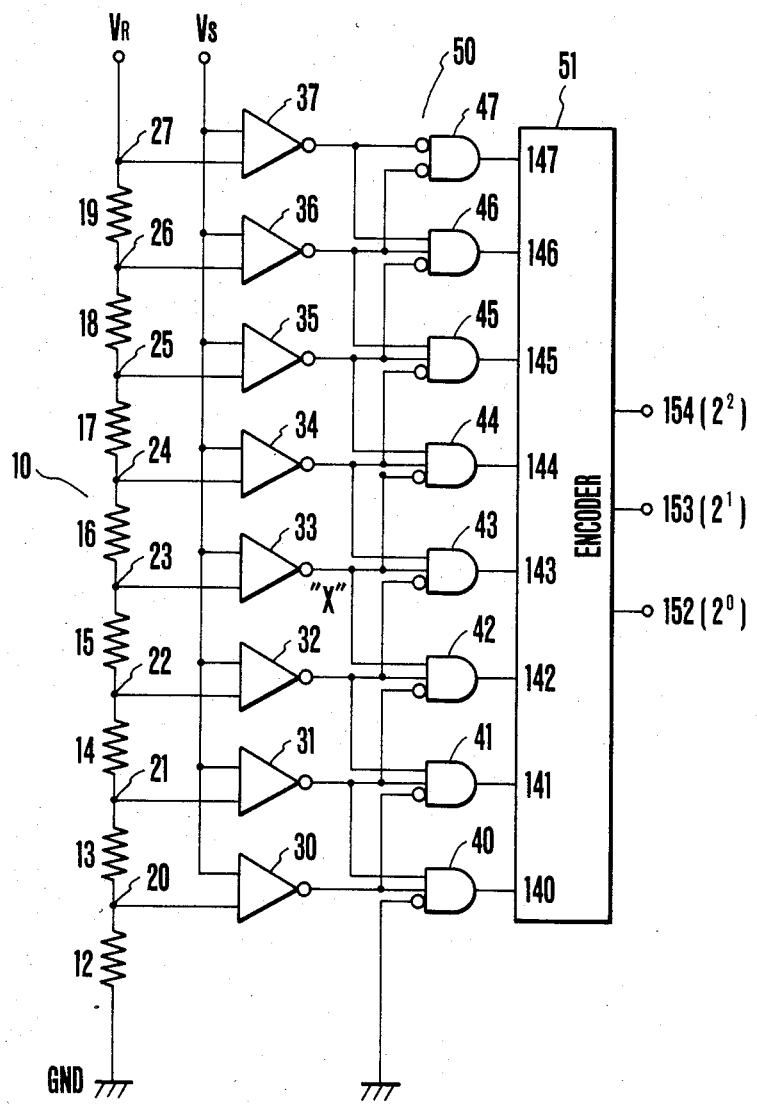
FIG. 1 is a circuit diagram showing a prior art parallel comparison type A/D converter.
Figure 3:
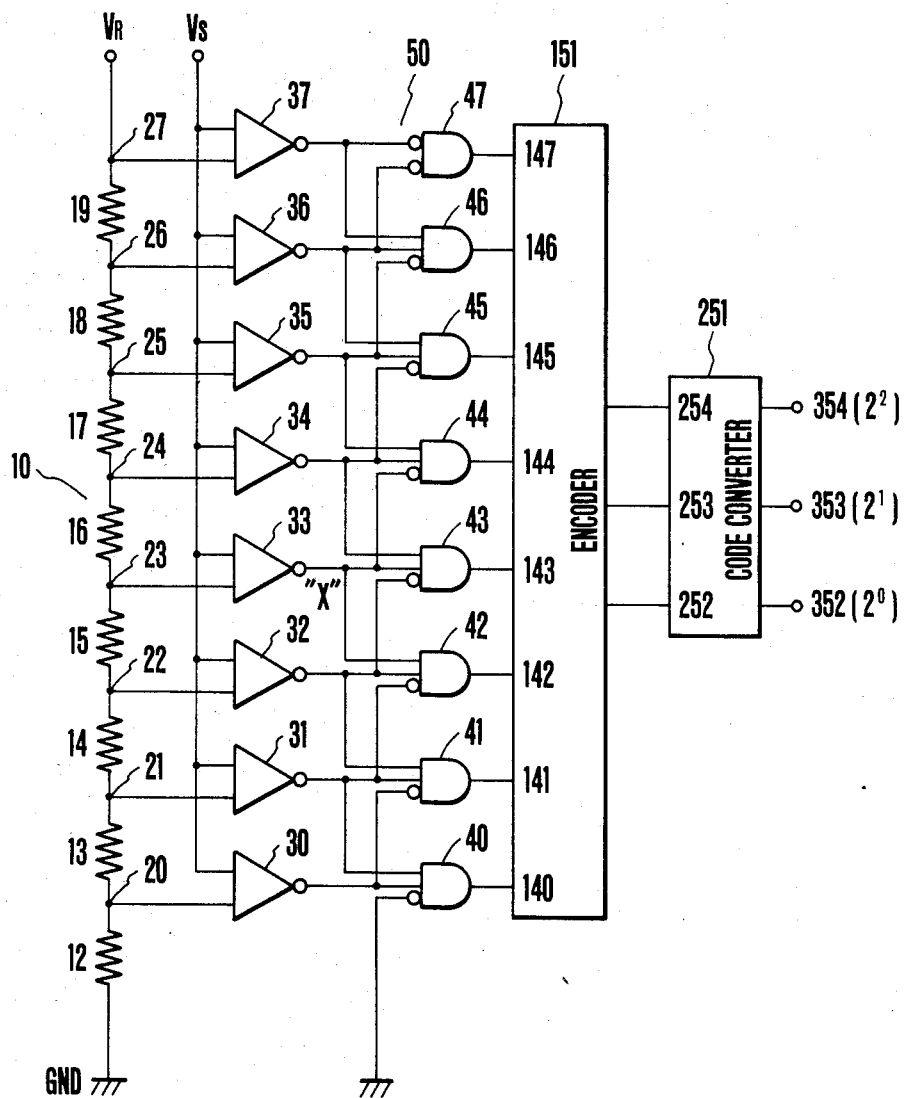
FIG. 3 is a circuit diagram showing a parallel comparison type A/D converter according to the invention.

FIG. 3 shows an embodiment of A/D converter of the invention in which N=3, N being the number of bits of the A/D converter output. In FIG. 3, the same elements as those in FIG. 1 are designated by the same reference numerals and operate in quite the same manner. Accordingly, they will not be described herein to avoid prolixity. What is different from the FIG. 1 construction lies in that the output of the position detection logic circuit 50 is coupled to an encoder 151, and the output thereof is coupled to a code converter 251 having digital output terminals 352 to 354.

In operation, the output of the position detection logic circuit 50 is encoded in the encoder 151 to produce a 3-bit digital signal. As the encoder 151 may be used a ROM type encoder as shown in FIG. 4a. This ROM encoder adopts a Gray code format as shown in FIG. 4b. The encoder 151 has a control terminal pattern corresponding to the Gray code format and respective control terminals 151a are connected to corresponding one of the selection input terminals 140 to 147. The operation of such an encoder is substantially the same as that of the previous encoder 51 and will not be described herein. Since the output of the encoder 151 is a Gray code, it is converted in the code converter 251 into a corresponding binary code. In this way, a digital output corresponding to the analog input voltage $V_s$ can be obtained.

As has been shown, a feature of the invention resides in that the output of the position detection logic circuit 50 is not directly converted to a binary code digital signal in a binary code encoder but it is first converted in the encoder based on the Gray code system into a Gray code digital signal which is then converted in the code converter into a corresponding binary code digital signal. This feature has an important effect in the event that two codes are simultaneously provided from the digital encoder 151 owing to an overlap selection of selection input terminals thereof. For example, in the event that the comparison of reference input voltage and analog input voltage $V_s$ in, for instance, the comparator 33 in FIG. 3 yields too small a difference to cause complete inversion of the comparator output so that the output is at an intermediate level "X" between "0" and "1", the intermediate level is supplied to one input terminal of each of the gates 42 to 44 in the position detection logic circuit 50. At this time, as described previously, the output of the gate 42 is "0" since the output of the comparator 32 is perfectly "0". Also, the outputs of the gates 43 and 44 are determined by the output level "X" of the comparator 33 since the outputs of the comparators 34 to 37 are all "1". At this time, if the input threshold value $V_{TP}$ of the non-inverted input terminal of the gate 43 is somewhat lower while the input threshold value $V_{TN}$ of the inverted input terminal of the gate 44 is somewhat higher, the non-inverted input to the gate 43 is "1" while the inverted input to the gate 44 is "0", so that both the gates 43 and 44 provide a "1" output. In consequence, the selection input terminals 143 and 144 of the encoder 151 are simultaneously selected. That is, the Gray code "010" corresponding to the selection input terminal 143 and the Gray code "110" corresponding to the selection input terminal 144 are overlapped. In such an event, a lower code always appears and the other upper code does not appear because in the Gray code system the codes representing sequential numbers differ only in one bit. That is, as a result of the above overlap of the Gray codes "010" and "110", the code "010" appears, and there appears no abnormal code "000" in the foregoing prior art example as in the case of the binary code system.

Figures 2A, 2B:
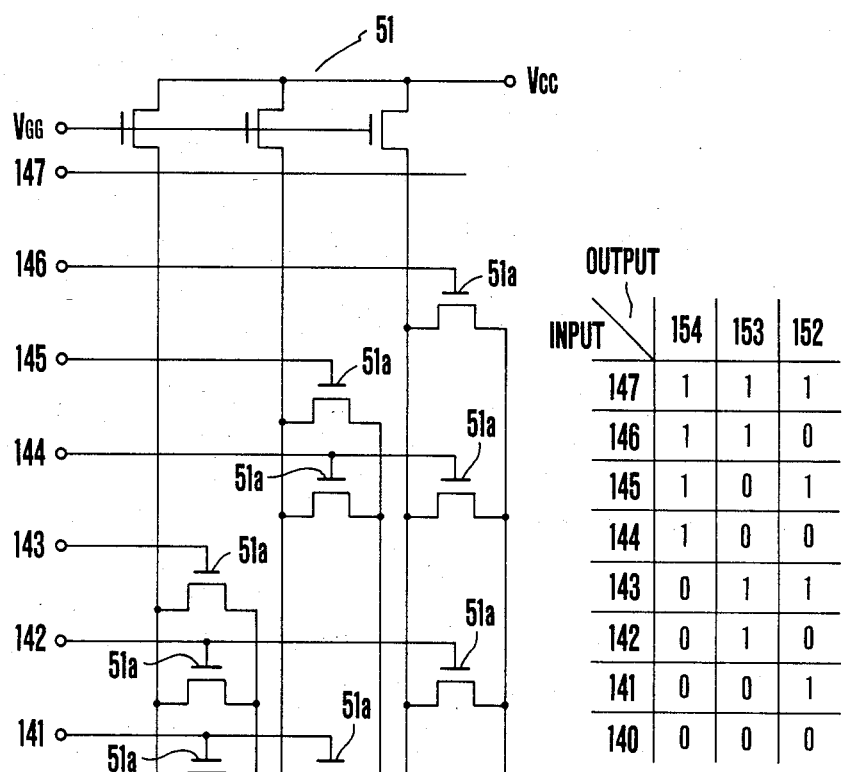
FIG. 2a illustrates an example of a read only memory type encoder circuit based on the binary code system.
FIG. 2b is a diagram showing 3-bit binary code outputs of the encoder.

As the code converter for converting the Gray code into a corresponding binary code, may be used an encoder comprised of only EXOR (exclusive-OR) gates as shown in FIG. 5. It will be seen that the Gray code format as shown in FIG. 4b is converted into the binary code format as shown in FIG. 2b through this code converter.

As has been described in the foregoing, according to the invention, unlike a binary code direct conversion system such as a conventional binary code system parallel comparison type monolithic analog-to-digital converter, there appears no abnormal code due to an indefinite comparator output. Thus, the monotonicity of the A/D converter will not be impaired. In addition, there is no need of increasing precision and gain of comparators to complicate the circuit construction and increase the scale of the circuit for the purpose of eliminating an indefinite comparator output. Moreover, no separate special circuit is required. Thus, it is possible to provide a parallel comparison type A/D converter, which is comparatively simple in construction and can be readily constructed as a monolithic IC, so that the invention is greatly beneficial.

What is claimed is:

1. An analog-to-digital converter comprising means for receiving an analog input voltage, means for generating a plurality of reference voltages, a plurality of comparators, each for comparing the analog input voltage with one of the reference voltages, each of said comparators being of the type which produces a first binary level output when said analog input voltage is at a first predetermined amount above the comparison voltage applied thereto, a second binary level output when said analog input voltage is at a second predetermined amount below the comparison voltage applied thereto, and an intermediate level output when said analog input voltage is between said comparison voltage plus said first predetermined amount and said comparison voltage minus said second predetermined amount, detection means responsive to outputs from said plurality of comparators to detect the boundary for an output of a comparator corresponding to the value of the analog input voltage, said detection means including a plurality of logic gates, each having a first logic input terminal receiving an output signal from the comparator of the same order and a second logic input terminal receiving an output signal from the comparator preceding by one gate in the order, among the outputs of said plurality of logic gates only one being rendered active when all of said comparators produce binary logic levels and at least two being rendered active when at least one of said comparators produces an intermediate level output which is not at a predetermined binary logic level, and means for converting the outputs of said logic gates into a Gray code, and means for converting the Gray code output into a binary code output.

2. A parallel comparison type monolithic A/D converter according to claim 1 further comprising a position detection logic circuit for detecting the boundary of two groups of said comparators, each group alternatively producing a high logic level or a low logic level, said position detection logic circuit producing on one of a plurality of outputs thereof a detection signal.

3. A parallel comparison type monolithic A/D converter according to claim 2 wherein said first code converter circuit comprises a ROM type encoder having a plurality of selection input terminals connected to the outputs of said position detection logic circuit, and a control terminal pattern corresponding to a Gray code format, the respective control terminals of the pattern being connected to corresponding one of the selection input terminals, and wherein said second code converter circuit comprises an arrangement of EXOR gates for conversion of the Gray code format to a binary code format.

4. A parallel comparison type monolithic A/D converter according to claim 1 wherein the number of the comparators is $2^N$ where N is the number of digits of said digital output of said A/D converter.

5. An analog-to-digital converter comprising a voltage dividing circuit for generating a plurality of ordered comparison voltages having different values; a plurality of ordered comparison circuits each comparing an analog input voltage with one of said comparison voltages, each of said comparison circuits being of the type which produces a first binary level output when said analog input voltage is at a first predetermined amount above the comparison voltage applied thereto, a second binary level output when said analog input voltage is at a second predetermined amount below the comparison voltage applied thereto and an intermediate level output when said analog input voltage is between said comparison voltage plus said first predetermined amount and said comparison voltage between minus said second predetermined amount; a detection circuit coupled to said comparison circuits for indicating the crossover between those comparison circuits which receive a lower comparison voltage than said analog input voltage and those comparison circuits which receive a higher comparison voltage than said analog input voltage; said detection circuit failing to detect the crossover when at least one of said comparison circuits generates said intermediate level output; a first code converter circuit for converting the output from said detection circuit into a Gray code, and a second code converter circuit for converting the Gray code into a corresponding binary code, the output of said second code converter circuit constituting the digital output of said analog-to-digital converter.

6. An analog-to-digital converter according to claim 5 wherein said first code converter circuit comprises a ROM type encoder having a plurality of selection input terminals connected to the outputs of said position detection circuit, and a control terminal pattern corresponding to a Gray code format, the respective control terminals of the pattern being connected to corresponding one of the selection input terminals, and wherein said second code converter circuit comprises an arrangement of EXOR gates for conversion of the Gray code format to a binary code format.

* * * * *